United States Patent [19]
Bhatia et al.

[11] Patent Number: 5,243,140
[45] Date of Patent: Sep. 7, 1993

[54] DIRECT DISTRIBUTION REPAIR AND ENGINEERING CHANGE SYSTEM

[75] Inventors: Harsaran S. Bhatia, Hopewell Junction; Mario J. Interrante, New Paltz; Suresh D. Kadakia, Poughkeepsie; Shashi D. Malaviya, Hopewell Junction; Mark H. McLeod, Poughkeepsie; Sudipta K. Ray; Herbert I. Stoller, both of Wappingers Falls, all of N.Y.

[73] Assignee: International Business Machines Corporation, Armonk, N.Y.

[21] Appl. No.: 771,707

[22] Filed: Oct. 4, 1991

[51] Int. Cl.[5] ............................................. H05K 1/00
[52] U.S. Cl. .................................. 174/254; 174/250; 361/777
[58] Field of Search ............... 174/254, 260, 261, 262, 174/264, 268; 361/418, 409, 400, 410

[56] References Cited
U.S. PATENT DOCUMENTS

| | | |
|---|---|---|
| 4,254,445 | 3/1981 | Ho . |
| 4,413,309 | 11/1983 | Takahashi et al. . |
| 4,453,176 | 6/1984 | Chance et al. . |
| 4,489,364 | 12/1984 | Chance et al. . |
| 4,546,413 | 10/1985 | Feinberg et al. . |
| 4,549,200 | 10/1985 | Ecker et al. . |
| 4,652,974 | 3/1987 | Ryan . |
| 4,706,165 | 11/1987 | Takenaka et al. . |
| 4,746,815 | 5/1988 | Bhatia et al. . |
| 4,840,924 | 6/1989 | Kinbara . |
| 4,880,959 | 11/1989 | Baum et al. . |

Primary Examiner—Leo P. Picard
Assistant Examiner—Cheryl R. Figlin
Attorney, Agent, or Firm—Whitham & Marhoefer

[57] ABSTRACT

A direct distribution wiring system is provided which facilitates the effecting of repair or engineering change in a Multi-chip module (MCM) while eliminating the need for redistribution and/or buried connections between IC attachment pads and engineering change pads, thus eliminating the need for patterned conductor layers corresponding to such functions. The operation of the MCM is improved by the wiring system allowing the reduction of lumped capacitances by disconnection of defective conductors, accomplished by providing severable connectors in a direct distribution structure, as well as the elimination of redistribution wiring layers and increased IC density on the MCM. Full potential fault coverage as well as full discretion in reversible engineering changes is provided by forming all elements of the wiring system on the surface of the device.

13 Claims, 4 Drawing Sheets

DIRECT DISTRIBUTION REPAIR AND ENGINEERING CHANGE SYSTEM

Cross-reference to Related Applications

This application is related to U.S. patent application Ser. No. 07/513,342, now U.S. Pat. No. 5,060,116, of Grobman et al., filed Apr. 20, 1990 and entitled ELECTRONICS SYSTEM WITH DIRECT WRITE ENGINEERING CHANGE CAPABILITY.

BACKGROUND OF THE INVENTION

1. Field of the Invention

The present invention generally relates to wiring systems for multi-chip modules (MCM) and, more particularly, to wiring systems which facilitate repair and engineering changes in multi-chip modules fabricated from a plurality of layers, such as multi-layer ceramic modules and module wiring formed by thin film techniques.

2. Description of the Prior Art

The formation of integrated circuit chips in accordance with different technologies has been known for a number of years. A demand for increased complexity of electronic systems including such integrated circuit chips has caused the development of multi-chip modules including a plurality of integrated circuit chips. Such modules are necessary when the desired circuitry must be integrated on chips by such differing technologies that formation on a single chip is impossible or economically disadvantageous or where the circuit complexity and device counts are too large to be integrated on a single chip consistent with good chip production yields.

Such multi-chip modules (MCM) usually take the form of relatively large, multi-layer constructions having a surface on which a plurality of chips may be mounted. The multi-layer construction is similar to multi-layer circuit boards in that wiring can be run in a direction parallel to the surface at the interface between any two layers. Wiring can be run perpendicular to the surface and between wiring layers with through-holes or "vias" in the layers which are selectively filled with conductive materials. Multi-chip modules have been implemented with a variety of technologies including multi-layered co-fired ceramics, silicon based thin film structures, ceramic based thin film structures and combinations of those techniques.

However, because of the multi-layer construction, there is no access to wiring other than on the surface of the multi-layer structure. Therefore, engineering changes cannot readily be made. Perhaps of equal importance is the fact that while electronic modules are large relative to the chips they contain, they are often very complex and of fairly small overall dimensions. Therefore, they are subject to connector defects in the same manner as the chips to be mounted thereon and manufacturing yields of the multi-layer structure must also be considered. The length of the conductors is quite substantial because complex wiring metallization must be provided to allow each output terminal of one chip to be connected to a plurality of other input terminals on other chips. Additionally, so-called fan-out wiring is often provided to interface between the fine wiring patterns characteristic of the connector spacing of the chips and the relatively more coarse wiring patterns on the MCM. The problem of circuit defects is aggravated by the manufacturing processes used to create the multi-layer structures which, for co-fired ceramic technology, involve spreading of a conductive paste with a nozzle through a fine stencil, both of which are subject to wear and scoring, and the lifting off of the paste where conductors are not desired. Either insufficient or irregular spreading of the conductive paste or the lifting off of small portions of the stencilled pattern may cause undesired conductor defects within the multi-layer structure.

Since such structures are complex and require a number of processing steps for each layer, substantial expense is involved in fabrication of the multi-layer structure. It is therefore economically important that the multi-layer structures be repairable. It is similarly important that engineering design changes be possible. In the past, this has been accomplished by a process known as "ECing", or the implementing of engineering changes, which required providing one or more layers of redistribution wiring from the chip I/O pads to EC pads on the top surface of the Multi-layer structure. The signal connection is then made by wiring from EC pad to EC pad and by redistribution wiring formed in the multi-layer structure from EC pad to chip I/O pad. However, these layers of redistribution wiring are also subject to the same potential defects as other wiring layers and are not repairable. Further, such patterns of redistribution wiring are in close proximity to each other, requiring high line (e.g. wiring pattern) quality, and a parasitic capacitance will exist causing signal delays, reduced noise margins, and other effects, thereby posing a severe restriction on wiring design rules. Additionally, to function for facilitating a wide variety of repair and engineering changes, hereinafter referred to collectively as engineering changes (EC), a significant amount of product and process complexity is required. This function also traditionally requires additional area for the redistribution wiring and EC pads, thus limiting the maximum possible density of the MCM. This, of course, also limits the performance of the MCM both operationally, from the number of ICs which can be included, and functionally due to delays, noise, etc., associated with longer wiring and parasitic capacitances.

Using previous technology, as shown in FIG. 6, a repair or engineering change is made by point-to-point wiring with a so-called "yellow wire" 110. To make an added connection, an end of the yellow wire was connected (e.g. bonded) to an EC pad 105 and the wire routed to another EC pad 111' where the other end was connected. A portion of the originally formed signal net 107, which may have been defective (e.g. at 108), is deleted by deleting the original connectors 106 from the EC pads to the signal pads 111. Performing such an operation on a small area of a module requires substantial complexity of automation, particularly where the connections are made for purposes of repairs and will change from module to module and must be combined with automated testing of the extremely complex circuits which are formed.

It should be noted from FIG. 6 that the connection from chip 101 to the EC pad 105 includes a pad 102, often referred to as a C4 pad, a via connection 103 below the EC pad, another via connection to the redistribution wiring layer 104 and similar connections to bring the connection back to the surface of the substrate. A defect 109 can occur at any point along this connection and such a defect is not repairable. It should be further noted from FIG. 6 that repair of defect 108 would normally be done from EC pad 105 to EC pad 105', removing both delete lines 106 and 106'. However, because a portion 112 of the signal net 107 remains intact, the "yellow wire" connection 110 can be made to either EC pad 105' or signal capture pad 111' but the delete line 106' must not be removed. Therefore, only the portion of the defective wiring between signal capture pad 111 and defect 108 can be removed from the circuit by removal of delete line 106 to reduce parasitic capacitance. Portion 107', which is non-functional because of defect 108 remains connected to the circuit and contributes to the parasitic capacitance. The same would be true of redistribution wiring 104 even if a repair could be accomplished since there is no way to remove any portion of the connection between the C4 pad 102 and EC pad 105 from the circuit.

As examples of other prior art wiring schemes which allow some degree of repairs and engineering changes to be made, U.S. Pat. No. 4,489,364 to Chance et al shows an electronic circuit module in which connections to pads to which chips are connected are buried within the body of the multi-layer structure but are periodically brought to the surface of the module and linked by EC pads of a so-called "dog-bone" shape. Continuity of these connections may be broken by severing the narrow portion of the dog-bone and EC connections may be made thereto either with or without severing the original connection. However, if a defect occurs in or between the C4 pad and the first EC pad, no repair is possible and the module must be discarded. The wiring through via holes is particularly vulnerable to the occurrence of discontinuities, as well, which may or may not be repairable and, in any event, repair would require point-to-point wiring over a considerable distance, further increasing parasitic capacitance of the overall wiring system. It can also be readily appreciated that the length of wiring involved in this scheme, including the repeated vertical traversals of the multi-layer structure through vias, is large and has a large lumped capacitance.

Additionally, U.S. Pat. No. 4,746,815 to Bhatia et al provides a switching circuit within the module to allow sharing of EC pads between receiver and driver circuits. U.S. Pat. No. 4,652,974 to Ryan, particularly at FIGS. 1 and 6, shows the complexity of the prior art redistribution wiring layers. U.S. Pat. No. 4,453,176 to Chance et al shows wiring to capacitances buried within the multi-layer structure. U.S. Pat. No. 4,840,924 to Kinbara shows a particular structure for the dog-bone EC pads. U.S. Pat. No. 4,254,445 to Ho shows a staggered chip location arrangement for a large number of chips in a module to minimize potential wiring crossovers and maximize the number of EC pads which can be provided. U.S. Patent to Ecker et al shows a repairable multi-level overlay system using redistribution. U.S. Pat. No. 4,546,413 to Feinberg et al shows a module structure in which EC pads are provided on both major surfaces of the multi-layer structure. U.S. Pat. No. 4,706,165 to Takenaka et al shows a multi-layer structure in which connections to module connection pins are made through vias to EC pads at the upper surface of the module to increase the types of engineering changes and repairs which can be made.

SUMMARY OF THE INVENTION

It is therefore an object of the present invention to provide a system for effecting repairs and/or engineering changes and which eliminates the need to provide redistribution wiring.

It is another object of the present invention to provide a system which facilitates repair and/or engineering changes in a multi-chip module which exhibits reduced parasitic capacitance and capacitive coupling between conductors.

It is a further object of the invention to provide a direct distribution wiring system for facilitating repairs and engineering changes in an MCM which will provide a broad latitude of discretionary wiring.

It is another further object of the present invention to provide support for engineering changes and repairs of an MCM using a reduced area of the top of the MCM, thereby providing increased density and performance.

It is yet another object of the present invention to provide a direct distribution wiring system which eliminates the parasitic capacitance of defective connections in an electronic circuit.

In order to satisfy the above and other objects of the present invention, a direct distribution wiring system for a substrate is provided having at least two connection pads arranged in an array, said wiring system including at least two direct distribution structures on a surface of said substrate, each said direct distribution structure including one of said connection pads, a signal pad spaced from said connection pad and a connection between said connection pad and said signal pad, and a conductor extending between said at least two direct distribution structures.

In accordance with another aspect of the invention, a method of effecting a repair or engineering change is provided including the step of forming a shunt between a connection pad and a conductor formed between ones of an array of connection pads.

BRIEF DESCRIPTION

The foregoing and other objects, aspects and advantages will be better understood from the following detailed description of a preferred embodiment of the invention with reference to the drawings, in which:

FIG. 1 is a plan view of an integrated circuit site showing some of the elements of the direct distribution wiring system in accordance with the invention, FIGS. 2 and 3 are enlarged views of a portion of FIG. 1 showing additional parts of the direct distribution wiring system in accordance with the present invention, FIGS. 4 and 5 are sectional views of the invention taken at section lines 4—4 and 5—5 indicated in FIG. 3, and FIG. 6, for comparison with the present invention, is a depiction of a typical construction of a simplified MCM structure, showing redistribution and signal nets.

DETAILED DESCRIPTION OF A PREFERRED EMBODIMENT OF THE INVENTION

Figure 1:
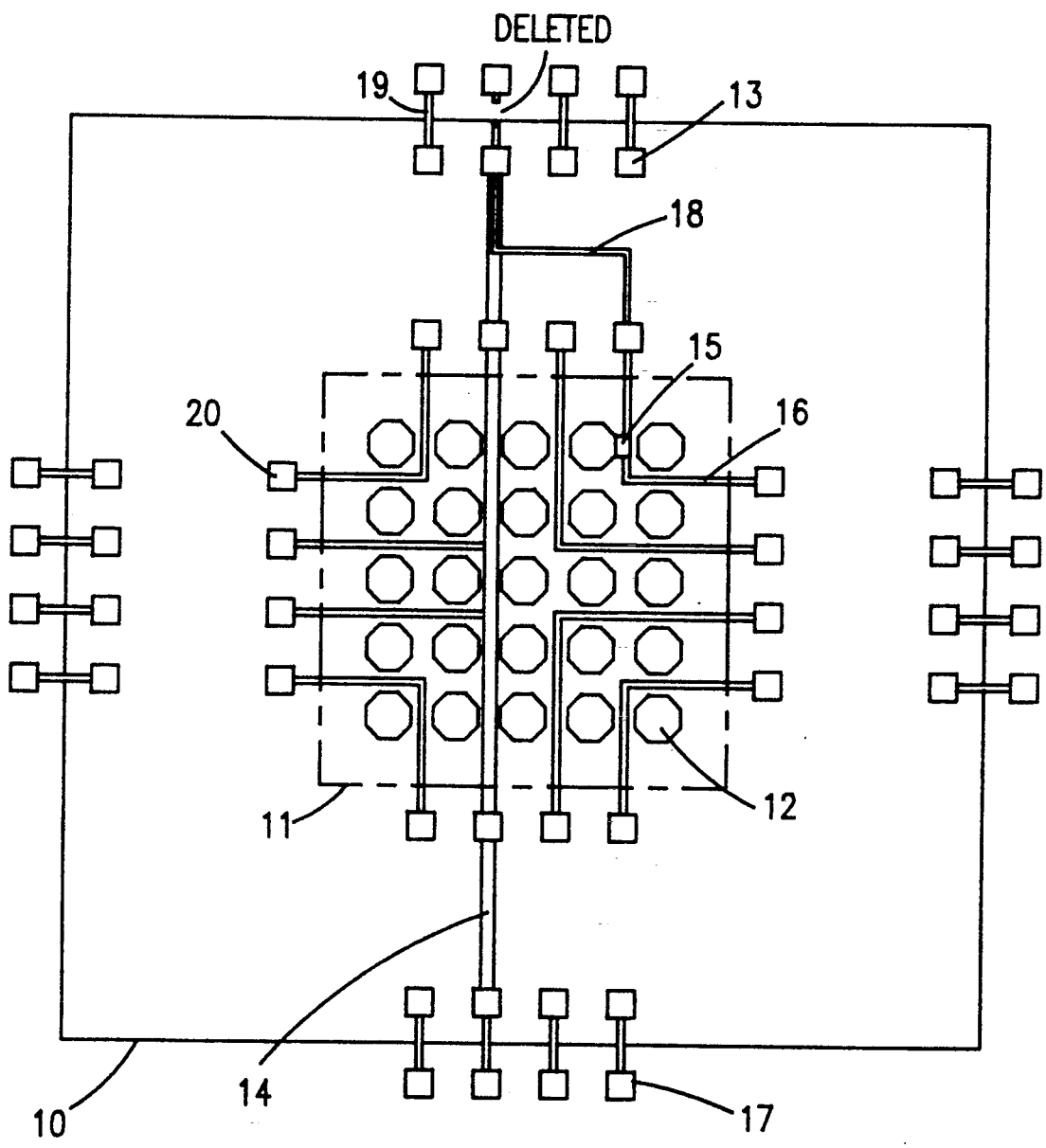

Referring now to the drawings, and more particularly to FIG. 1, there is shown a plan view of a site for mounting a single integrated circuit (IC) chip which may be included on a circuit board, card, or, preferably, a multi-chip module (MCM), hereinafter collectively referred to as a substrate, in accordance with the present invention. It should be noted in the following discussion that, regardless of the type of substrate (e.g. single-layer structure, multi-layer structure, card, circuit board, circuit module, etc.) in which the invention may be implemented, the layers and circuitry which otherwise would be fabricated remain unchanged other than the omission of a redistribution net for providing buried connections to the EC pads which are obviated by the present invention. Therefore, a detailed discussion of the MCMs or other substrates or the particular types of integrated circuit chips with which the invention can be used is not necessary to a full understanding of the invention. It should also be noted that the elements of the direct distribution wiring system which are affixed to the substrate can be formed by any metallization, metal deposition or metal removal process in order to provide a conductor pattern on the substrate in accordance with the invention.

Figure 4:
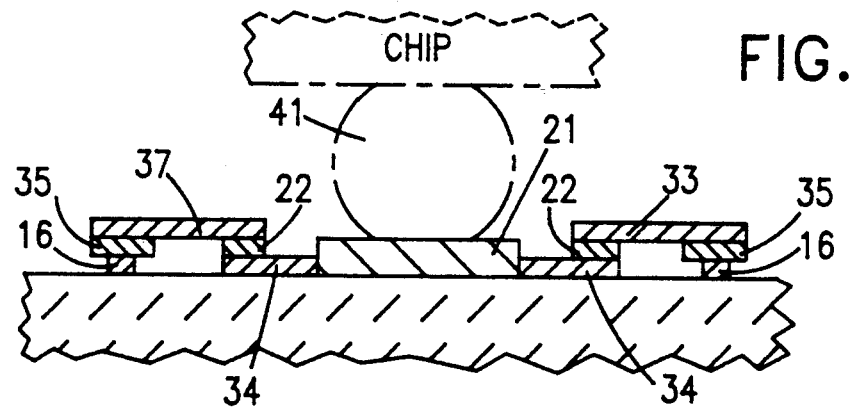
Figure 5:
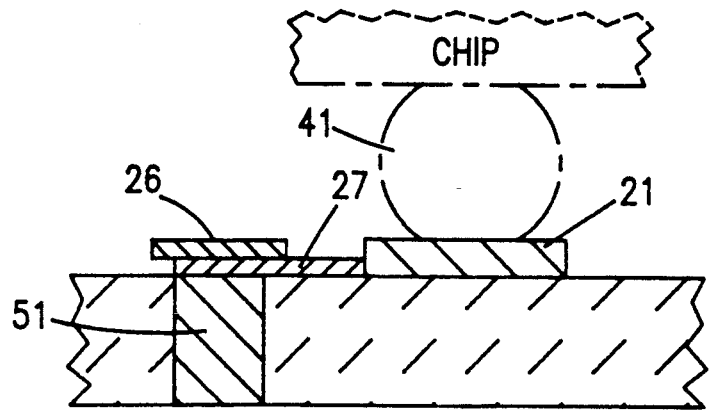
Figure 6:
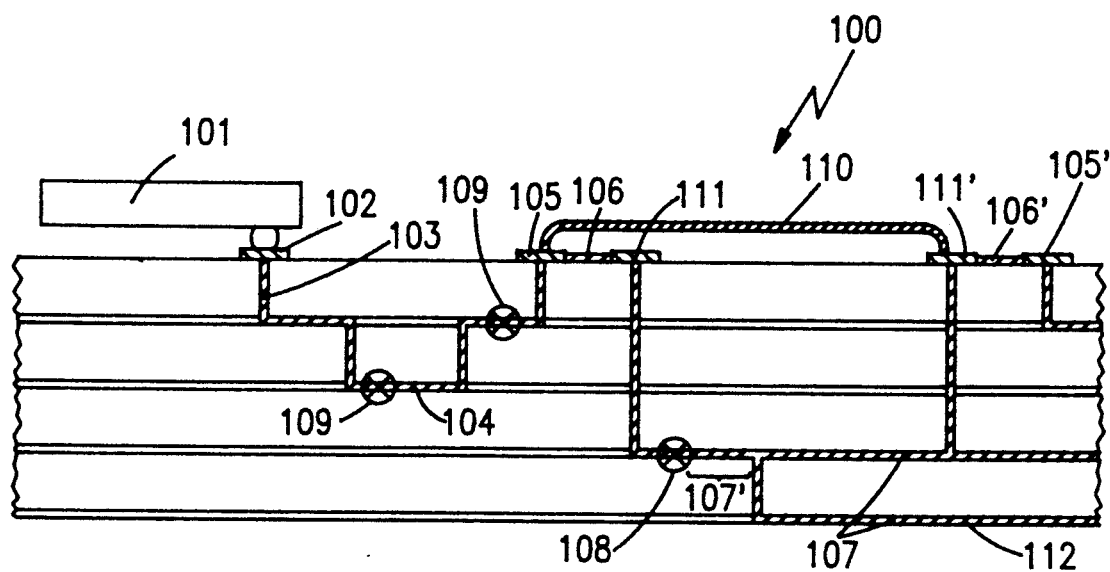

An IC chip 11 is located as shown with an array of C4 terminals on the lower side thereof and arranged to be connected to a connection pad such as C4 pads on the top of the substrate. These C4 structures are usually formed as raised beads of solder on the chip (as shown by dashed lines in FIGS. 4 and 5) which form both a mechanical and electrical bond to the MCM or substrate when the IC Chip is placed in compression against the C4 pads on the MCM or substrate and the entire device heated to cause reflow of the solder. As in the prior art, connections are made through the multi-layer structure in the module to other chip sites. In order to make an EC connection, in the prior art, it was necessary to provide a connection from the C4 pads to EC pads through a redistribution net. It is particularly important to an understanding of the significance of the present invention to recognize that in the prior art, since the locations of defects or desired engineering changes are, by their nature, unpredictable, connections from each C4 pad to an EC pad is necessary to enable all possible defects to be corrected and provide for a full range of engineering changes to be accomplished. It is also important to note that the redistribution net of the prior art, which is avoided by the present invention, contained a mandatory connection from every C4 pad of the IC site to at least one corresponding EC pad and, thus, comprised a minimum number of EC pads and conductors. Whether the conductors were formed on the surface of the MCM or substrate or buried within it, the number and necessary length thereof consumed at least a certain irreducible amount of space and exhibited a minimum parasitic or lumped capacitance, both of which limit the ultimate performance of the MCM or substrate, as pointed out above. It is equally important to recognize that the goal of full coverage of possible defects and engineering changes could not be accomplished for the simple reason that the connection from the C4 pads to the EC pads of the prior art were also often buried and subject to the same potential for the occurrence of defects as the signal nets. By the same token, redistribution nets intended to provide good defect coverage are very complex and of high capacitance; compromising the cost and/or performance of the circuit. Further, it is important to note that the connection from a C4 pad to an EC pad could neither be repaired nor removed from the circuit to reduce capacitance due, in large part, to the connection to the C4 pad being made from directly beneath the C4 pad, as shown in FIG. 6.

In contrast, the present invention provides a much simplified system for facilitating correction of defects and the implementation of engineering changes. The wiring system, according to the invention, is a direct distribution system (DDS) which completely obviates the need for redistribution which was previously required. The invention provides for a discretionary connection from C4 pads to EC pads on an "as-needed" basis. This greatly reduces the number of EC pads required, thus allowing improved circuit density and performance. It also provides for minimization of connected wiring length involved in repairs and ECs to maximize module performance without compromising yield.

Figure 2:
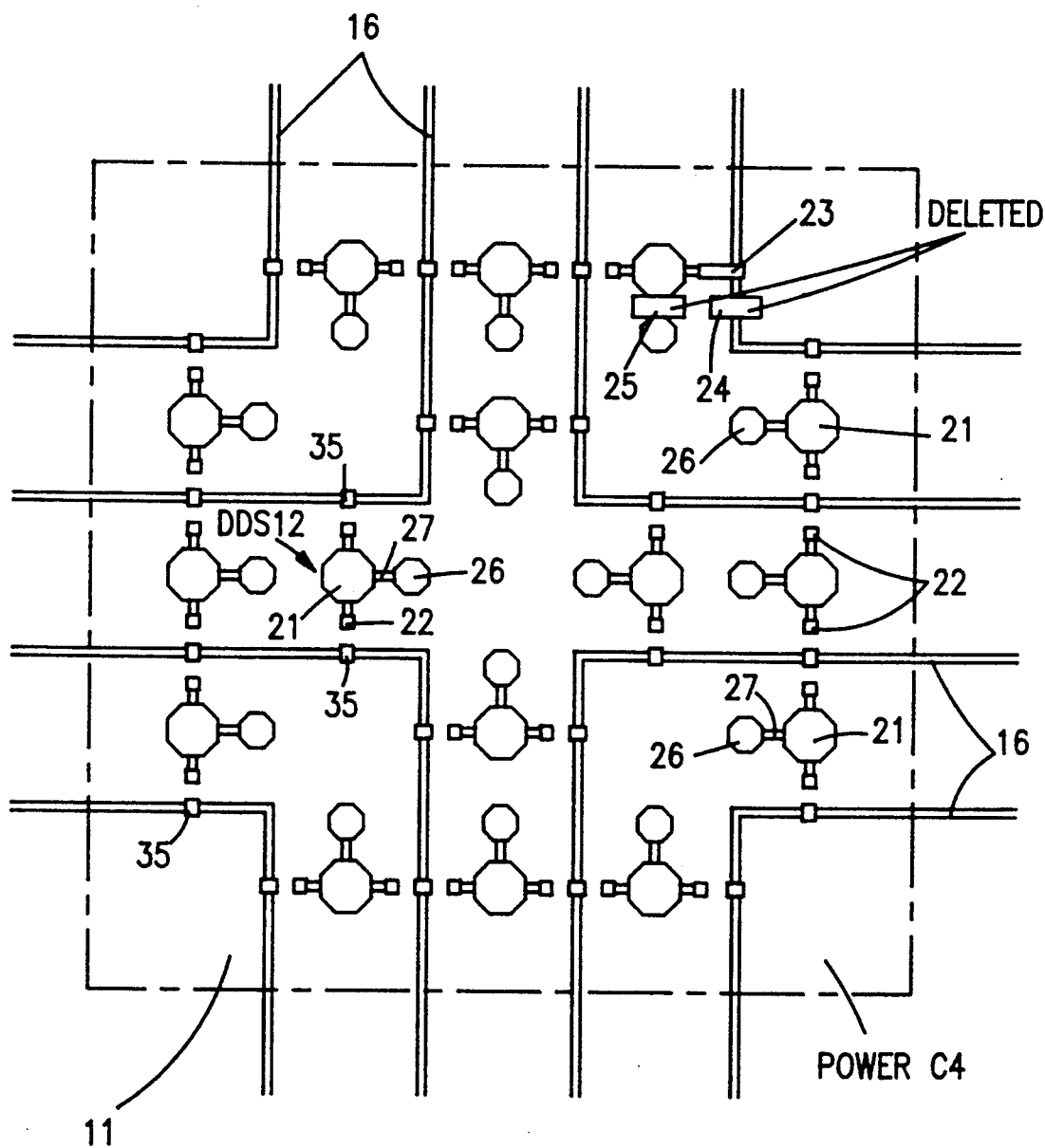
Figure 3:
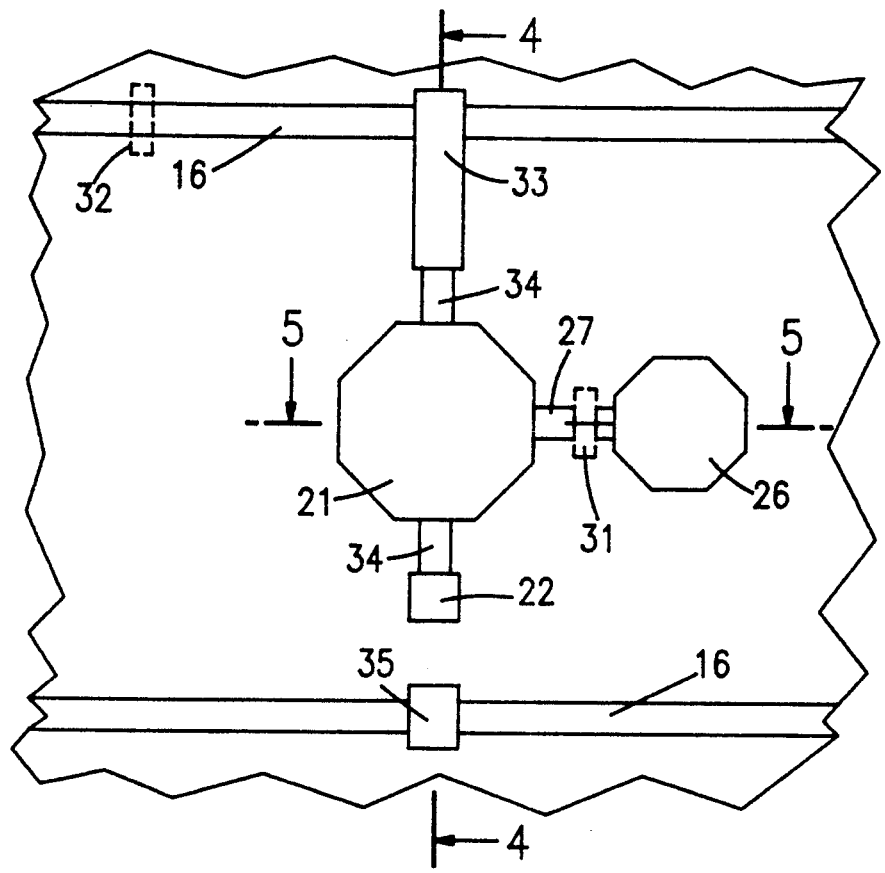

The wiring system of the present invention includes, but is not limited to, C4 pad 21, LST signal pad 26, C4 bond pad 22, EC lines such as elbow lines (ECE) 16, EC elbow or connection pads 35, EC pads 13 and delete lines 27 from C4 pads 21 to signal pads 26, buried EC wires (BECW) 14, buried EC delete lines (BECDL) 19 and buried EC pads (BECP) 17. (It should be noted that these latter structures are not, in fact, buried, but are so denominated since they are directly connected to buried wiring structures and provide electrical access thereto. Additionally, the DDS is a compound structure as shown in FIGS. 2 and 3, preferably including a C4 signal capture pad 21, a signal pad 26 and a delete line 27 including a delete site 31 connecting the signal pad 26 and the signal capture pad 21. Further, the C4 pad, in accordance with the invention, includes at least two C4 bond pads 22, including connection 34 which may be connected to pads 35 formed on the EC lines 16 by selectively deposited metallization or hard wiring, as will be described in greater detail below.

In combination, these elements provide a wiring system which is fully accessible on the surface of the MCM or substrate and which provides sufficient flexibility to fully cover all possible required repairs and engineering changes. This flexibility is provided by the pattern of EC lines, preferably in the form of ECEs 16, which are located between the C4 pads 21 and the use of signal capture pads 26, connected to the C4 pads 21 by delete lines 27 to form the DDS 12. This structure most clearly contrasts with the prior art in that the C4 pad does not cover the site of the via 51 (FIG. 5) which forms a connection to buried circuitry and that the connections from the C4 pads to the EC pads do not require any portion of that connection to be buried. By the same token, since all of the connections to the C4 pad, provided by the system of the invention, lie on the surface of the MCM or substrate, all ECs are reversible. Numerous other benefits of the invention will become apparent from the following discussion of the manner in which a repair or an EC is made.

First, the delete line 27 connecting the C4 pad to the signal pad is severed by abrasion, laser vaporization, ablation or other techniques. This severing of the connection is particularly important in the case of repairs since it allows the segment of buried defective conductor to be disconnected from the circuit, reducing the lumped capacitance of the multi-layer connection structure.

Second, a shunt 33, formed by selective metallization or other process, a staple bond or the like, is made to connect the C4 bond pad 22 to an ECE bond pad 35. This shunt may be formed by a laser chemical vapor deposition process (hereafter L-CVD) wherein localized heating by a laser in the presence of a metal precursor (e.g. a metal compound) which causes the metal precursor to decompose into a volatile gas and a metal which is thereby deposited on the locally heated area. The L-CVD process is described, for example in Baum et al., U.S. Pat. No. 4,880,959, assigned to the assignee of the present invention and which is hereby fully incorporated by reference herein. Alternatively, the shunt may be formed by short "yellow wires", as described above, or by the simultaneous bonding of both ends of the "yellow wires" 37 to the respective bonding pads 22, 35 in a process called staple bonding. The staple bonding process is described in detail in Interrante et al, U.S. patent application Ser. No. 07/771,706 (and U.S. patent application Ser. No. 07/849,854, which is a division thereof), entitled APPARATUS AND METHOD FOR MAKING SIMULTANEOUS ELECTRICAL CONNECTION, filed on even date herewith and which is also fully incorporated by reference herein. ECE bond pads 22, are preferably patterned in the form of tabs, as shown, to provide a target for the laser. The potential locations for shunts will determine the location and positions of the ECE bond pads, as shown in exemplary form in FIG. 2. In general, the number of ECE bond pads or tabs 22 would normally be two although four such ECE bond pads might be advantageously provided for the central C4 pad in the pad array shown in FIG. 1. Location of the ECE bond pads 35 will also generally be at the sides of the C4 pads at the points of the EC lines which are closest to each C4 pad.

Third, the ECE 16 is severed near the shunt 33 as shown at "delete" 32 in FIG. 3. This has the effect of removing the capacitance of the remainder of the line from the circuit node comprising the C4 pad, the shunt and the portion of the ECE 16 which will be used. Perhaps of equal importance, the remainder of the ECE 16 can be then used for connection to another DDS, if desired or required.

Fourth, to complete the connection to the C4 pad, a "yellow wire" 18 is bonded from the EC pad, connected to the used portion of the ECE 16, to a BECP 17.

Fifth, assuming this connection is to be made to insert a portion of the IC into an existing circuit, the BECW 14 connecting two BECP's is severed. Also, based on this assumption, the above steps would be only sufficient to form the desired circuit at either the input or the output of the IC and would be repeated to complete the entire circuit.

Sixth, and finally, yellow wires, not shown, would be installed to connect the BECPs corresponding to the severed BECDLs, as desired.

It should be noted that the above steps would be carried out when at least the IC corresponding to that site was not in place, either prior to installation or after removal of the IC for the purpose of effecting the change or repair. It should also be noted that only those EC pads 13 involved in a repair or engineering change are ever connected to C4 pads and that any use thereof is entirely discretionary. Further, since all such connections used are entirely on the surface of the device, as shown in the sectional views of FIGS. 4 and 5, they are repairable and changes are reversible. Unused ECEs and EC pads are not connected to the circuit and do not contribute to the capacitance of the connections in the device.

While the ECE form of engineering change wiring shown in FIGS. 1-3 is deemed preferable from the standpoint of minimizing the length and capacitance of both the used portion of ECE 16 and the "yellow wires" (since connection to any given C4 pad can be made on either of two sides of the IC site and can thus also limit the need for crossing of yellow wires), other configurations may be preferable for other reasons. For instance, straight line EC wiring might be used to simplify fabrication or a serpentine configuration could be used to increase connection flexibility. Plural EC lines could also be provided between C4 connections, regardless of EC line configuration to assure adequate coverage of large integrated circuits with large numbers of connections.

In view of the above, it is seen that the above direct distribution EC wiring system simplifies the multi-layer structure by eliminating layers otherwise necessary for redistribution and for connecting the C4 pads to EC pads. The lumped capacitance of the connections in the multi-layer structure is reduced by the minimization of wiring lengths (ECE and "yellow wire") needed for repair or engineering changes and the ability to disconnect lengths of defective or unused conductors in the course of repairs or engineering changes. The connections from the C4 pads to the EC pads, to the extent that they are used, are all repairable and all engineering changes are reversible. The system of the invention, by permitting connections to C4 pads only where necessary provides full coverage of all possible defects which may occur, allows full discretion in the manner in which ECs are carried out, minimizes the space consumed by EC pads to maximize circuit density and minimizes the support necessary to effect repairs and engineering changes.

While the invention has been described in terms of a single preferred embodiment, those skilled in the art will recognize that the invention can be practiced with modification within the spirit and scope of the appended claims.

We claim:

1. A direct distribution wiring system for a substrate having at least two connection pads arranged in an array corresponding to terminals of an electronic device, said wiring system including
   at least two direct distribution structures on a surface of said substrate, each said direct distribution structure including one of said connection pads, a signal pad spaced from said connection pad and a connection between said connection pad and said signal pad, and
   a conductor extending between and spaced from said at least two direct distribution structures.

2. A wiring system as recited in claim 1, further including
   a shunt extending from a portion of one said direct distribution structures to said conductor.

3. A wiring system as recited in claim 1, wherein said shunt is formed by a selectively deposited metallization.

4. A wiring system as recited in claim 2, further including a further connection pad attached to at least one end of said conductor.

5. A wiring system as recited in claim 1, wherein at least one of said connection and said conductor are severable.

6. A wiring system as recited in claim 1 wherein said conductor has an angle formed at a predetermined location along its length.

7. A method of effecting a repair or engineering change in a substrate including a direct distribution structure on a surface of said substrate, said direct distribution structure including a connection pad for connecting a circuit element to said substrate, a terminal spaced from at least one said connection pad and a connection between said connection pad and said terminal, and a conductor extending in the proximity of and spaced from said direct distribution structure, including the step of forming a shunt between said connection pad and said conductor.

8. A method as recited in claim 7, including the further step of severing at least one of said conductor and said connection.

9. A direct distribution wiring system for a substrate comprising:
   a substrate;
   a plurality of direct distribution structures arrayed on a surface of said substrate in accordance with terminals of an electronic device, at least one of said direct distribution structures including a connection pad, a signal pad spaced from said connection pad, and a connection between said connection pad and said signal pad;
   a plurality of engineering change pads proximate to said direct distribution structures; and
   at least one conductor extending between and spaced from at least two of said direct distribution structures and connected to at least one of said engineering change pads.

10. A direct distribution wiring system as recited in claim 1 wherein said engineering change pads surround said direct distribution structures.

11. A direct distribution wiring system as recited in claim 9, further including
   a shunt extending from a portion of one said direct distribution structures to said conductor.

12. A wiring system as recited in claim 9, wherein at least one of said connection and said conductor are severable.

13. A wiring system as recited in claim 9 wherein said conductor has an angle formed at a predetermined location along its length.

* * * * *